United States Patent [19]

Fuchs

[11] Patent Number: 4,742,182
[45] Date of Patent: May 3, 1988

[54] FLATPACK FOR HERMETIC ENCAPSULATION OF PIEZOELECTRIC COMPONENTS

[75] Inventor: Dieter Fuchs, Landshut, Fed. Rep. of Germany

[73] Assignee: Schott Glaswerke, Mainz, Fed. Rep. of Germany

[21] Appl. No.: 927,489

[22] Filed: Nov. 6, 1986

[30] Foreign Application Priority Data

Nov. 7, 1985 [DE] Fed. Rep. of Germany ....... 3539504

[51] Int. Cl.⁴ .............................................. H05K 5/06
[52] U.S. Cl. ............................... 174/52 FP; 310/340; 357/73
[58] Field of Search ................... 174/52 FP; 310/312, 310/313 C, 340, 344, 351–353; 357/73

[56] References Cited

U.S. PATENT DOCUMENTS

| 4,110,655 | 8/1978 | Hata et al. ........................... 310/344 |
| 4,293,986 | 10/1981 | Kobayashi et al. ............. 310/344 X |
| 4,362,961 | 12/1982 | Gerber .......................... 310/344 X |

FOREIGN PATENT DOCUMENTS 2946222 5/1980 Fed. Rep. of Germany .
3105197 9/1982 Fed. Rep. of Germany .

Primary Examiner—A. T. Grimley
Assistant Examiner—David A. Tone
Attorney, Agent, or Firm—Millen & White

[57] ABSTRACT

A flatpack package for hermetic encapsulation of piezoelectronic components, which flatpack is suitable for use in efficient and automated surface mounting (SMT). The flatpack package consists of a base plate, a cover plate and a mounting unit of two support frames between which are placed lamellar connecting leads leading into the package. The leads serve both for mechanical holding of the quartz resonator disk and as the electrical connection thereof. All the package parts are produced from glass, are connected to one another by using solder glass as a sealing material. The parts are dilathermally matched with one another.

9 Claims, 4 Drawing Sheets

FLATPACK FOR HERMETIC ENCAPSULATION OF PIEZOELECTRIC COMPONENTS

BACKGROUND OF THE INVENTION

This invention relates to packages for hermetic encapsulation of piezoelectric components, especially quartz resonators.

As a general practice quartz resonators are encapsulated so that the quartz disk (which has an electrode exposed on each side) is wedged in vertical position between two metal springs which are insulated from a base plate. The metal springs pass through the base plate so that over the base plate is placed a package whose bottom edges are hermetically sealed to the base plate.

The search for piezoelectric components with smaller space requirements and lower production costs has led to flatpacks, in which the quartz resonator is placed horizontally, whereby the two leads are bent in the direction of the printed circuit board (PCB) and are fastened to it. This is known as SMT or surface mounting technology.

Such a flat piezoelectric resonator is described in German Patent DE-OS No. 34 27 548, however the component described therein has disadvantages. For example, a simultaneous vapor deposition of both electrodes on the quartz resonator disk is not possible. This extends production time and makes the production process more difficult. In addition, tuning of the resonance frequency cannot take place simultaneous with deposition of the vapor and a fine tuning of the resonance frequency is not possible after closing of the package.

SUMMARY OF THE INVENTION

An object of this invention is a flatpacck for hermetic encapsulation of piezoelectric components, which is suitable for a particularly efficient and automated surface mounting (SMT), and which meets the following requirements:

1. The package sealing is impermeable to permanent gases and does not allow any permeation of gases and vapors (especially water vapor).
2. The flatpack has as small an overall height as possible so as to make possible a high packing density on the printed circuit board.
3. Automation of the mounting process for the quartz disk and sealing of the package is possible.
4. A simultaneous vapor deposition of the electrodes on the quartz resonator disk, i.e., simultaneously on both sides, without formation of shadows is feasble.
5. Tuning of the resonance frequency is able to take place simultaneously with vapor deposition.
6. Final trimming of the resonance frequency after sealing of the package is possible.
7. The temperature stress of the piezoelectric element (quartz resonator) during mounting and sealing of the package is minimized.

To meet the aforementioned requirements, above all with respect to the seal of the flatpack, all the package components must be dilathermally matched with one another, i.e., the coefficients of thermal expansion of the various components must agree during the continuous temperature interval while the package is being sealed.

In order to accomplish the above identified object and other objects the instant invention contemplates a flatpack for hermetic encapsulation of piezoelectric components for surface mounting. The flatpack comprises a glass base plate having an inner surface and a glass cover plate having an inner surface. First and second support frames made of sintered glass; are aligned with one another along juxtaposed surfaces. The frames have oppositely disposed surfaces and are disposed between the inner surfaces of the glass base plate and the inner surface of the glass cover plate to form a package. The frames define a space therein for receiving a piezolectric component. Lamellar connecting leads are disposed between the first and second support frames and past the package formed by the support frames and plates. Hermetic seals formed of ceramized glass are disposed between and bonded to the surfaces of the plate frames and contacts.

Upon further study of the specification and appended claims, further objects and advantages of this invention will become apparent to those skilled in the art.

BRIEF DESCRIPTION OF THE DRAWINGS

Various other objects, features and attendant advantages of the present invention will be more fully appreciated as the same becomes better understood when considered in connection with the accompanying drawings, in which like reference characters designate the same of similar parts throughout the several views, and wherein.

DESCRIPTION OF THE PREFERRED EMBODIMENTS

Figure 1:
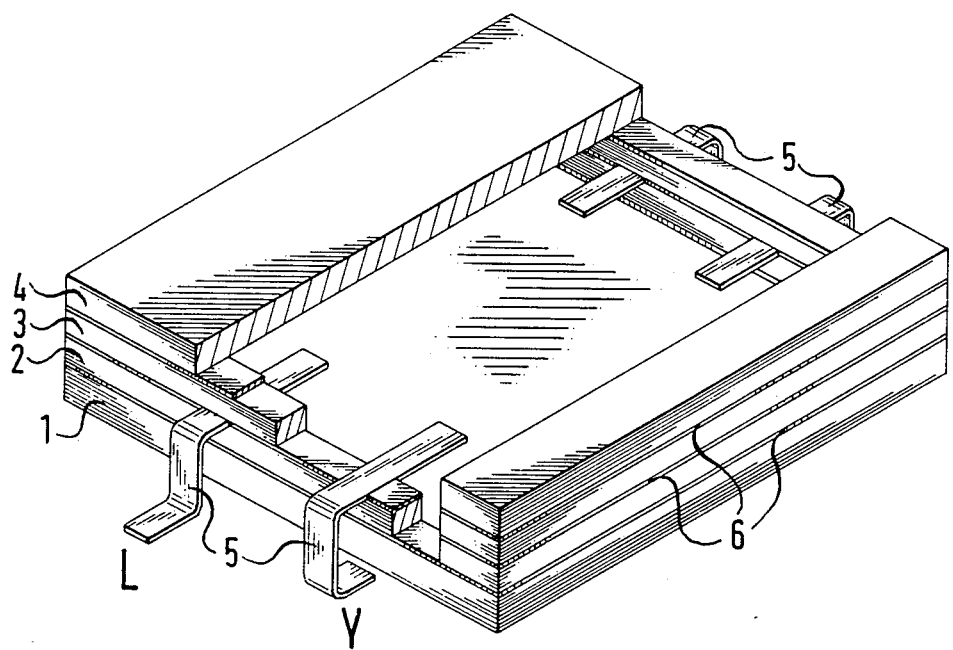
FIG. 1 shows the flatpack according to the invention in perspective representation, partially sectioned.
Figure 2:
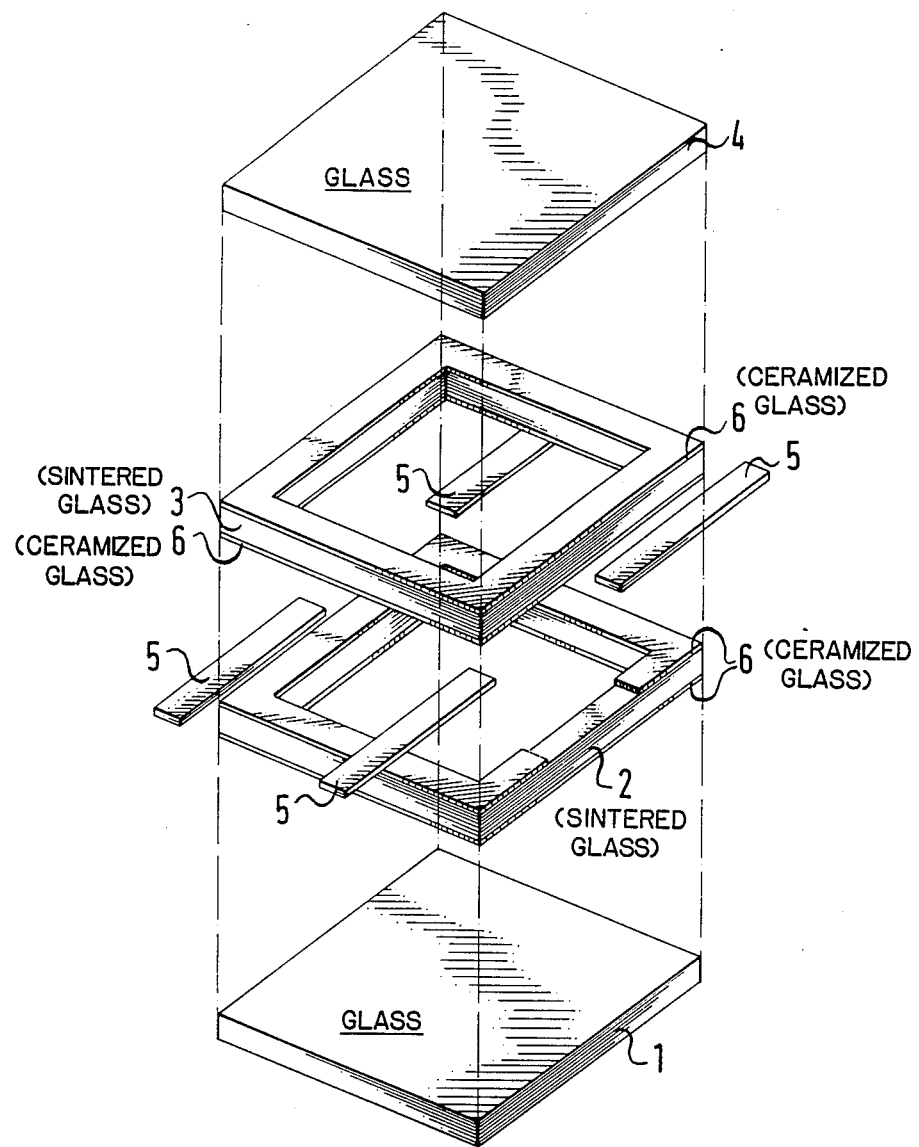
FIGS. 2 and 3 are exploded representations and show the individual parts of the package or of the mounting unit.

The package as a whole consists of the following parts:
base plate 1;
cover plate 4.

The two support frames 2 and 3 are coated on the front side with a sealing material 6.

Electric connecting elements 5 are formed as thin metal lamellae. They later serve as supports for the quartz disk, electric connections of the electrodes and also for mounting to the PCB's and as electric connections to the circuit.

Figure 3:
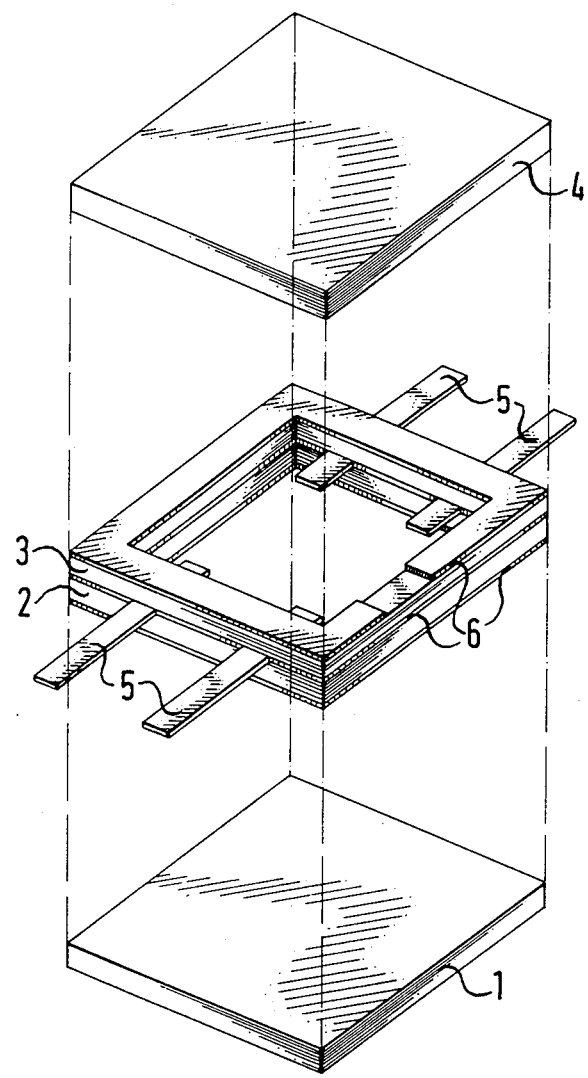

In the case of premounting, the two support frames 2 and 3, coated with the sealing material, are simultaneously hermetically connected to connecting lamellae 5 in between the frames. This unit consisting of individual elements 2, 3, 5 and 6, represents the actual mounting unit for the quartz resonator, (FIG. 3).

After mounting of the quartz resonator (not shown) and after tuning the resonance frequency, the mounting unit, provided with the tuned quartz, is hermetically sealed to the base plate 1 and cover plate 4 in one operation by means of the sealing material present on the outermost upper and lower front surfaces of the mounting unit (FIG. 1).

According to the invention, glass is used as the basic material. For example, two embodiments are possible:

(1) the glasses used have a thermal expansion of about $9 \times 10^{-6}/K$ or (2) the glasses used have a thermal expansion of about $5 \times 10^{-6}/K$.

In embodiment (1), the lamellar connecting leads 5 advantageously are made of an NiFe alloy; in embodiment (2) they are advantageously made of an NiFeCo alloy.

Various materials can be used as the sealing material. But if the requirement is observed that no water vapor must permate, then stable or ceramizing solder glasses are a possible choice. These solder glasses must, of course, also be dilathermally matched with the components to be joined.

Embodiment (1) is preferred if the thermal stress of the quartz linked to the soldering of the mounting unit with built-in quartz element with the base plate 1 and cover plate 4 is taken into consideration.

Assembly of the Mounting Unit

The two support frames 2 and 3 are produced from sintered glass and are coated on the front side with solder glass. The connecting lamellae 5 are placed between these two support frames 2 and 3. This unit is soldered, with light pressure if necessary.

Figure 4:
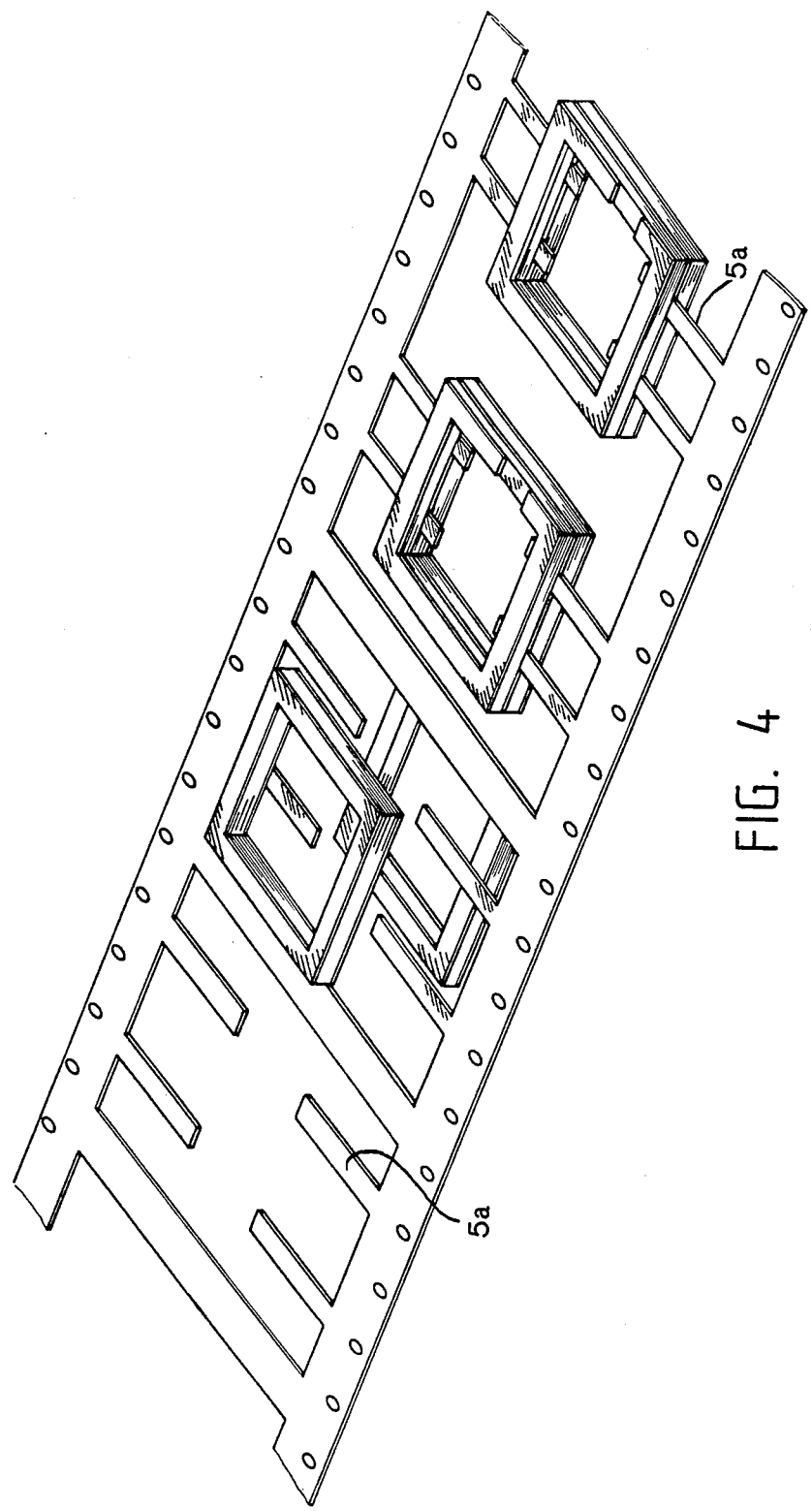
FIG. 4 is an embodiment of the invention wherein strip lamellae are used as connectors.

The lamellae 5 can be encapsulated either as separate connecting and mounting elements or as continuous strip lamellae 5a running parallel to one another (see FIG. 4). The quartz resonator disk (not shown) can be fastened to these individual lamellae 5 or to the strip lamellae 5a on the interior of the mounting unit by means of a conducting adhesive. If necessary, suitable spring and holding systems for receiving the quartz disk can be welded to the lamellae 5 or 5a. Moreover, the lamellae inside the mounting unit can be shaped by stamping into suitable holding or spring systems. Independently of the holding or spring shape, the quartz disk comes to lie in the center of the mounting unit in the case of equally thick support frames. However, it can be equallized, depending on the spring shape, by the support frames 2 and 3 having different thickness so that the quartz disk comes to lie in the center of the package.

There are two processes available for mounting of the quartz disk:

1. A quartz disk, already provided with vapor deposited electrodes, is fastened to the lamellae 5 with a conducting adhesive. since the mounting unit is equally accessible on both sides, a simultaneously frequency tuning can then take place.

2. A quartz disk is fastened to the lamellae 5 with a conducting adhesive. Then simultaneous vapor deposition of the electrodes on both sides of the crystal blank takes place. In this case, there is the possibility of attaining the desired resonance frequency without subsequent tuning of the resonance frequency. However, in this case care must be taken that a shadowing does not occur during the vapor deposition by an unfavorable spring configuration.

Sealing of the Flatpack

The mounting unit with the tuned quartz installed therein is soldered to the base plate 1 and cover plate 4 by means of the solder glass 6 that is on the front surface of the mounting unit, if required with the application of a light pressure. Base plate 1 and cover plate 4 can be made of sintered or clear glass parts. During the soldering process small evaporation rates occur and lead to a "mass loading" of the quartz crystal and the drift of the resonance frequency linked thereto. A final trimming of the resonance frequency can be made if necessary with a laser beam if the base plate and cover plate are made of clear glass plates.

Shaping the Connecting Lamellae for the Surface Mounting

After the completion of the package, it is necessary to form the connecting lamellae for the surface mounting either in the form designated by the letter L or the form designated by the letter Y. But it is also possible to encapsulate already preformed lamellae 5 in the mounting unit. This latter solution offers the advantage that the glazing is no longer stressed. But in the subsequent fashioning of the lamellae 5 in each case there would be a mechanical stress of the glazing, which in the extreme case could lead to leakage of the package.

For efficient, automated production it is possible to produce the lamellae from a strip as illustrated by the lamellae of FIG. 4. This process can also be used for the preformed lamellae.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A flatpack for hermetic encapsulation of a piezolectric component, for use in surface mounting, including a base plate, a cover plate and placed between them, lamellar connecting leads into the flatpack, the improvement characterized in that:

the connecting leads are integral with a mounting unit, the cover plate, the base plate and mounting unit are made of glass, the cover plate, the base plate and the mounting unit are hermetically connected to one another by stable or ceramizing solder glass, and the mounting unit includes two support frames of sintered glass, which are hermetically connected to one another by a ceramizing solder glass.

2. The flatpack according to claim 1, wherein the piezoelectric component is a quartz disc and wherein the lamellar connecting leads are configured to serve both for mechanical mounting of the quartz disk and an electrical connection thereof to a circuit with which the piezoelectric component is connected.

3. The flatpack according to claim 1, wherein the base plate and cover plate are made of clear glass.

4. The flatpack according to claim 1, wherein the lamellar connecting leads are already preformed components.

5. The flatpack according to claim 1, wherein the piezoelectric component is a quartz resonator adhered to the lamellar connecting leads with a conductive adhesive, the electrode having electrodes thereon formed by vapor deposition on both sides thereof simultaneously prior to assembling the flatpack.

6. The flatpack according to claim 1, wherein the piezoelectric component is a quartz resonator having electrodes deposited thereon prior to connection with the leads, the leads being connected to the electrodes by a conductive adhesive providing a mounted quartz resonator which is accessible from both sides prior to assembly in a flatpack; whereby simultaneous frequency tuning of the quartz resonator can be accomplished.

7. A flatpack for hermetic encapsulation of piezoelectric components for surface mounting, the flatpack comprising:

a glass base plate having an inner surface;

a glass cover plate having an inner surface;

first and second support frames made of sintered glass; the frames being aligned with one another along juxtaposed surfaces, having oppositely disposed surfaces and being disposed between the inner surface of the glass base plate and the inner surface of the glass cover plate to form a package; the frames defining a space therein for receiving a piezoelectric component;

lamellar connecting leads disposed between the first and second support frames and extending both into the space defined by the frames and past the package formed by the support frames and plates, and hermetic seals formed of ceramized glass disposed between and bonded to the surfaces of the plates, frames and contacts.

8. The flatpack of claim 7, wherein the glasses used for the plates frames and seals have a thermal expansion of about $9 \times 10^{-6}/K$ and the lamellar connecting leads are made of NiFe alloy.

9. The flatpack of claim 7, wherein the glasses used have a thermal expansion of about $5 \times 10^{-6}/K$ and the lamellar connecting leads are made of NiFe Co alloy.

* * * * *